United States Patent
Ljubijankic et al.

(10) Patent No.: US 10,770,839 B2
(45) Date of Patent: Sep. 8, 2020

(54) ASSEMBLY METHOD FOR A PRINTED CIRCUIT BOARD ELECTRICAL CONNECTOR

(71) Applicant: Amphenol Corporation, Wallingford, CT (US)

(72) Inventors: Zlatan Ljubijankic, Mississauga (CA); Barbara H. Marten, Toronto (CA); Ming Jong, North York (CA); Andy Toffelmire, Whitby (CA)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/108,633

(22) Filed: Aug. 22, 2018

(65) Prior Publication Data
US 2020/0067236 A1   Feb. 27, 2020

(51) Int. Cl.
| | |
|---|---|
| H01R 13/6585 | (2011.01) |
| H05K 3/34 | (2006.01) |
| H01R 12/71 | (2011.01) |
| H01R 13/11 | (2006.01) |
| H01R 43/16 | (2006.01) |
| H01R 43/24 | (2006.01) |
| H01R 13/512 | (2006.01) |
| H01R 12/70 | (2011.01) |

(52) U.S. Cl.
CPC ....... *H01R 13/6585* (2013.01); *H01R 12/707* (2013.01); *H01R 12/716* (2013.01); *H01R 13/111* (2013.01); *H01R 13/512* (2013.01); *H01R 43/16* (2013.01); *H01R 43/24* (2013.01); *H05K 3/3447* (2013.01)

(58) Field of Classification Search
CPC .. H01R 12/716; H01R 13/514; H01R 12/585; H01R 13/518; H01R 12/7082; H01R 13/41; H01R 43/24; H01R 13/405; H01R 13/6594; H01R 43/16; H01R 12/58; H01R 12/714; H01R 12/724; H01R 12/727; H01R 13/052; H01R 13/20
See application file for complete search history.

(56) References Cited

U.S. PATENT DOCUMENTS

| | | | |
|---|---|---|---|
| 5,137,462 A | 8/1992 | Casey et al. | |
| 5,236,376 A | 8/1993 | Cohen | |
| 5,385,490 A * | 1/1995 | Demeter | H01R 9/038 439/289 |
| 5,580,283 A | 12/1996 | O'Sullivan et al. | |

(Continued)

FOREIGN PATENT DOCUMENTS

EP    0 793 303 A2    9/1997

*Primary Examiner* — Edwin A. Leon
*Assistant Examiner* — Matthew T Dzierzynski
(74) *Attorney, Agent, or Firm* — Blank Rome LLP

(57) ABSTRACT

A method of assembling an electrical connector that is configured for mounting to a printed circuit board. The method has the steps of providing contact wafers with a plurality of contacts; bending the tail ends of each contact wafer; interleaving the contact wafers to form one or more contact wafer assemblies; loading the contact wafer assemblies into an insert of the electrical connector, such that the one or more contact wafer assemblies form a predetermined arrangement of mating ends of the plurality of contacts at a mating interface of the electrical connector; and inserting the insert into a shell of the electrical connector.

25 Claims, 6 Drawing Sheets

(56) References Cited

U.S. PATENT DOCUMENTS

| | | | |
|---|---|---|---|
| 5,667,411 A * | 9/1997 | O'Sullivan | H01R 13/41 439/701 |
| 5,722,861 A * | 3/1998 | Wetter | H01R 13/514 439/701 |
| 5,816,829 A * | 10/1998 | Chiang | H01R 13/405 439/76.1 |
| 5,967,841 A * | 10/1999 | Bianca | B29C 45/0003 439/590 |
| 6,065,979 A | 5/2000 | Lai et al. | |
| 6,261,107 B1 | 7/2001 | Takase et al. | |
| 6,375,507 B1 | 4/2002 | Van Koetsem et al. | |
| 6,582,244 B2 | 6/2003 | Fogg et al. | |
| 6,743,053 B2 | 6/2004 | Wu | |
| 7,431,616 B2 * | 10/2008 | Minich | H01R 13/514 439/607.05 |
| 7,442,085 B2 * | 10/2008 | Fuerst | H01R 13/514 439/620.09 |
| 7,658,624 B2 * | 2/2010 | Fang | H01R 12/714 439/79 |
| 7,713,085 B2 | 5/2010 | Wu et al. | |
| 7,867,045 B2 * | 1/2011 | McAlonis | H01R 13/052 439/682 |
| 7,909,668 B2 * | 3/2011 | McAlonis | H01R 12/585 439/701 |
| 8,038,465 B2 * | 10/2011 | Pavlovic | H01R 13/514 361/719 |
| 8,083,554 B2 * | 12/2011 | McAlonis | H01R 12/585 439/733.1 |
| 8,382,524 B2 * | 2/2013 | Khilchenko | H01R 13/6616 439/620.09 |
| 9,362,638 B2 * | 6/2016 | Ljubijankic | H01R 13/514 |
| 9,450,344 B2 * | 9/2016 | Cartier, Jr. | H01R 43/24 |
| 9,742,081 B1 | 8/2017 | Annis et al. | |
| 9,806,443 B1 | 10/2017 | Thackston | |
| 9,991,642 B1 * | 6/2018 | Ljubijankic | H01R 13/24 |
| 10,003,145 B1 | 6/2018 | Annis et al. | |
| 10,243,307 B2 * | 3/2019 | Ljubijankic | H01R 12/716 |
| 10,312,613 B2 * | 6/2019 | Taylor | H05K 7/023 |
| 10,476,176 B2 * | 11/2019 | De Deken | H01B 1/02 |
| 2002/0146926 A1 | 10/2002 | Fogg et al. | |
| 2004/0077228 A1 * | 4/2004 | Wu | H01R 13/514 439/701 |
| 2004/0259420 A1 * | 12/2004 | Wu | H01R 9/0515 439/607.05 |
| 2008/0020645 A1 | 1/2008 | Fuerst et al. | |
| 2009/0163050 A1 | 6/2009 | Fang et al. | |
| 2010/0022142 A1 | 1/2010 | Mcalonis | |
| 2010/0075538 A1 | 3/2010 | Ohshida | |
| 2013/0122755 A1 * | 5/2013 | Smith | H01R 13/514 439/701 |
| 2017/0077617 A1 | 3/2017 | De Deken et al. | |

* cited by examiner

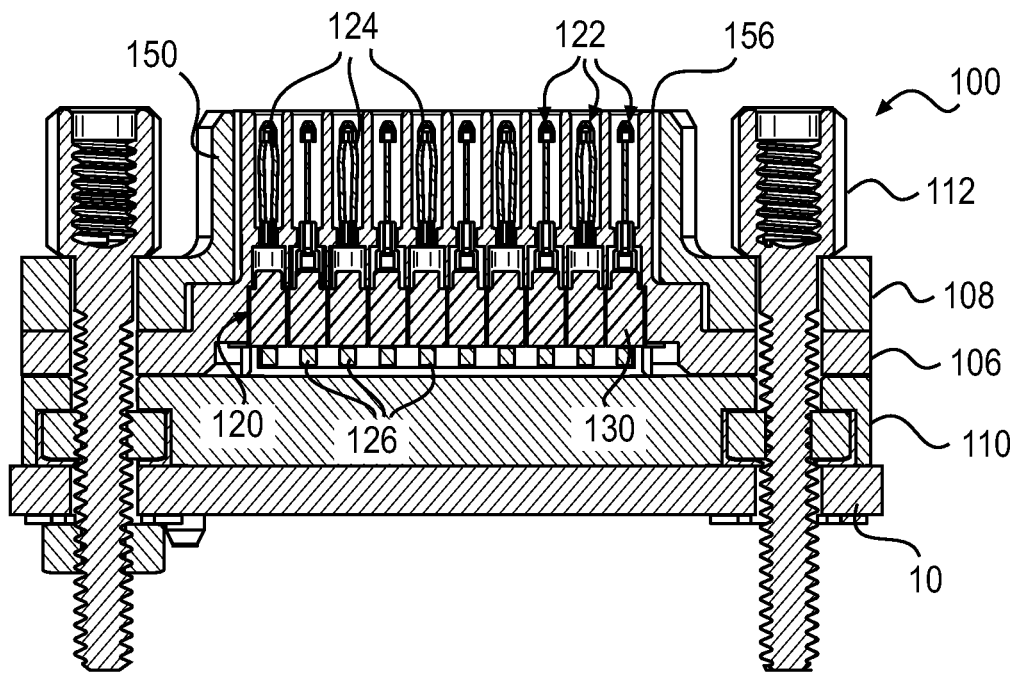
FIG. 2A
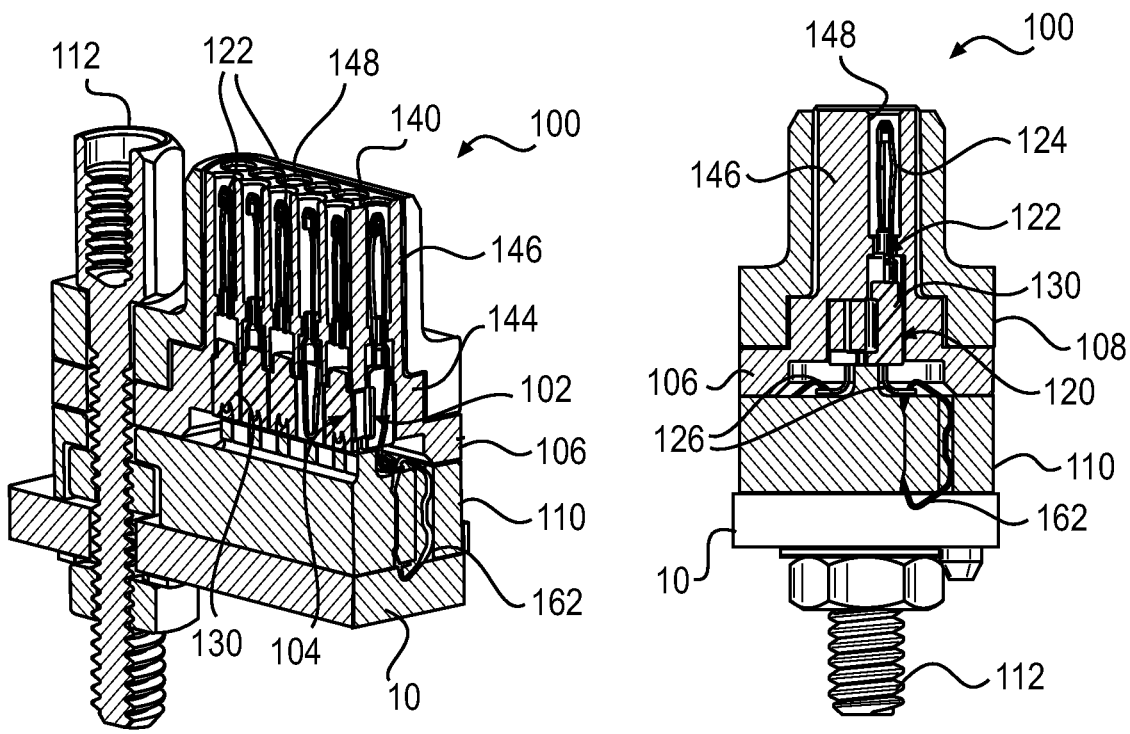
FIG. 2B  FIG. 2C

ASSEMBLY METHOD FOR A PRINTED CIRCUIT BOARD ELECTRICAL CONNECTOR

FIELD OF THE INVENTION

The present invention relates to a method for assembling an electrical connector of the type configured for a printed circuit board, such as a micro D or D-shaped electrical connector.

BACKGROUND

Manufacture and assembly of electrical connectors, such as those configured for use with a printed circuit board, like micro D and D-shaped connectors, is often time consuming and cumbersome. That is because when assembling a standard micro D electrical connector, for example, numerous steps are required. Those steps can include removing the individual contacts from a reel, crimping each of those contacts, installing each of the crimped contacts into a holder, inserting the holder with the crimped contacts into a shell, adding thin potting layer to the shell, arranging and managing the contact terminations, and then adding thicker potting layer to the shell. The terminations are arranged and managed to provide the correct termination position for installation onto the printed circuit board. The thin and thick potting layers are added to secure the contacts in position and prevent shorts after termination management. The steps of adding the thin potting layer, adding the thicker potting layer, and contact termination management, in particular, make the manufacturing and assembly process inefficient and burdensome.

Therefore, a need exists for a method of assembling an electrical connector to be installed on a printed circuit board, that is efficient and eliminates time consuming and cumbersome steps.

SUMMARY

The present invention may provide a method of assembling an electrical connector, the electrical connector being configured for mounting to a printed circuit board, that comprises the steps of providing a plurality of contact wafers, each contact wafer including a plurality of contacts supported by a housing, wherein each of the plurality of contacts includes a mating end for engaging a mating connector and a tail end for electrically connecting to the printed circuit board, the mating and tail ends being exposed outside of the housing; bending the tail ends of each contact wafer; interleaving the contact wafers to form one or more contact wafer assemblies; loading the one or more contact wafer assemblies into an insert of the electrical connector, such that the one or more contact wafer assemblies form a predetermined arrangement of the mating ends of the plurality of contacts at a mating interface of the electrical connector; and inserting the insert, with the one or more contact wafer assemblies, into a shell of the electrical connector.

In one embodiment, the method further comprises the step of installing a contact support member at the tail ends of the contact wafers and the contact support member may include a plurality of conductive springs corresponding to each of the plurality of contacts. In some embodiments, the method may further comprise the step of coupling the insert, the shell, and the contact support together or the step of testing the electrical connector for electrical conductivity therethrough after the step of coupling the insert, the shell, and the contact support together; the step of coupling may include inserting at least one fastener through each of the insert, the shell, and the contact support member, the fastener being configured to engage the printed circuit board for mounting the electrical connector thereto; and/or the fastener may be configured to engage the printed circuit board for mounting the electrical connector thereto such that the one or more contact wafer assemblies are electrically connected to the printed circuit board via the tail ends of the plurality of contacts.

In certain embodiments, the method further comprised the step of soldering the tail ends of the plurality of contacts to the printed circuit board; no potting material or layer is added to the electrical connector; neither the step of loading the one or more contact wafer assemblies in the insert nor the step of inserting the insert into the shell, includes the step of managing the plurality of terminations; the method further comprises the step of combining at least two contact wafer assemblies to form the predetermined arrangement of the mating ends of the plurality of contacts; the contact wafers of one of the two contact wafer assemblies may have a different or the same number of plurality of contacts from one another; the contact wafers of the other of the two contact wafer assemblies may have a different or the same number of plurality of contacts from one another.

In other embodiments, the method may further comprise the step of selecting from the plurality of contact wafers at least two contact wafers that may have a different or the same number of the plurality of contacts from one another to form at least one of the contact wafer assemblies; each of the contact wafers has a different number of contacts from the other contact wafers; and/or the method may further comprise the step of combining at least two of the contact wafer assemblies to form the predetermined arrangement of the mating ends of the plurality of contacts.

The present invention may also provide a method of assembling an electrical connector, the electrical connector being configured for mounting to a printed circuit board, that comprises the steps of providing a plurality of contact wafers, each contact wafer including a plurality of contacts supported by a housing, wherein each of the plurality of contacts includes a mating end for engaging a mating connector and a tail end for electrically connecting to the printed circuit board, the mating and tail ends being exposed outside of the housing, and wherein at least one contact wafer is formed with four contacts, at least one contact wafer is formed with five contacts, and at least one contact wafer is formed with six contacts; interleaving the contact wafers to form one or more contact wafer assemblies; loading the one or more contact wafer assemblies into an insert of the electrical connector, such that the one or more contact wafer assemblies form a predetermined arrangement of the mating ends of the plurality of contacts at a mating interface of the electrical connector; and inserting the insert, with the one or more contact wafer assemblies, into a shell of the electrical connector.

In some embodiments, the step of interleaving includes interleaving one of the contact wafers with four, five, or six contacts with another of the contact wafers with four, five, or six contacts to form at least a first contact wafer assembly of the contact wafer assemblies; the step of interleaving includes interleaving one of the contact wafers with four, five, or six contacts with another of the contact wafers with four, five, or six contacts to form at least a second contact wafer assembly of the contact wafer assemblies; the method may further comprise the step of combining the first and the second contact wafer assemblies to form the predetermined arrangement of the mating ends of the plurality of contacts; the step of loading the contact assemblies into the insert includes loading the combined first and second contact wafer assemblies; each of the contact wafers with four, five, and six contacts includes at least one weakened area between the contacts; the method may further comprise the step of breaking at least one of the contact wafers with four, five, and six contacts at the at least one weakened area, thereby forming multiple contact wafers therefrom; and/or the method may further comprise the step of bending the tail ends of each contact wafer prior to the step of interleaving the contact wafers. In one embodiment, the predetermined arrangement of the mating ends of the plurality contacts at the mating interface of the electrical connector is one of a 9-position, a 15-position, a 21-position, a 25-position, a 31-position, a 37-position, a 41-position, a 51-position, a 69-position, or a 100-position or any other varying number of contacts as desired.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 2A-2C are various cross-sectional views of the electrical connector illustrated in FIG. 1, once the electrical connector is assembled;

DETAILED DESCRIPTION

Figure 1:
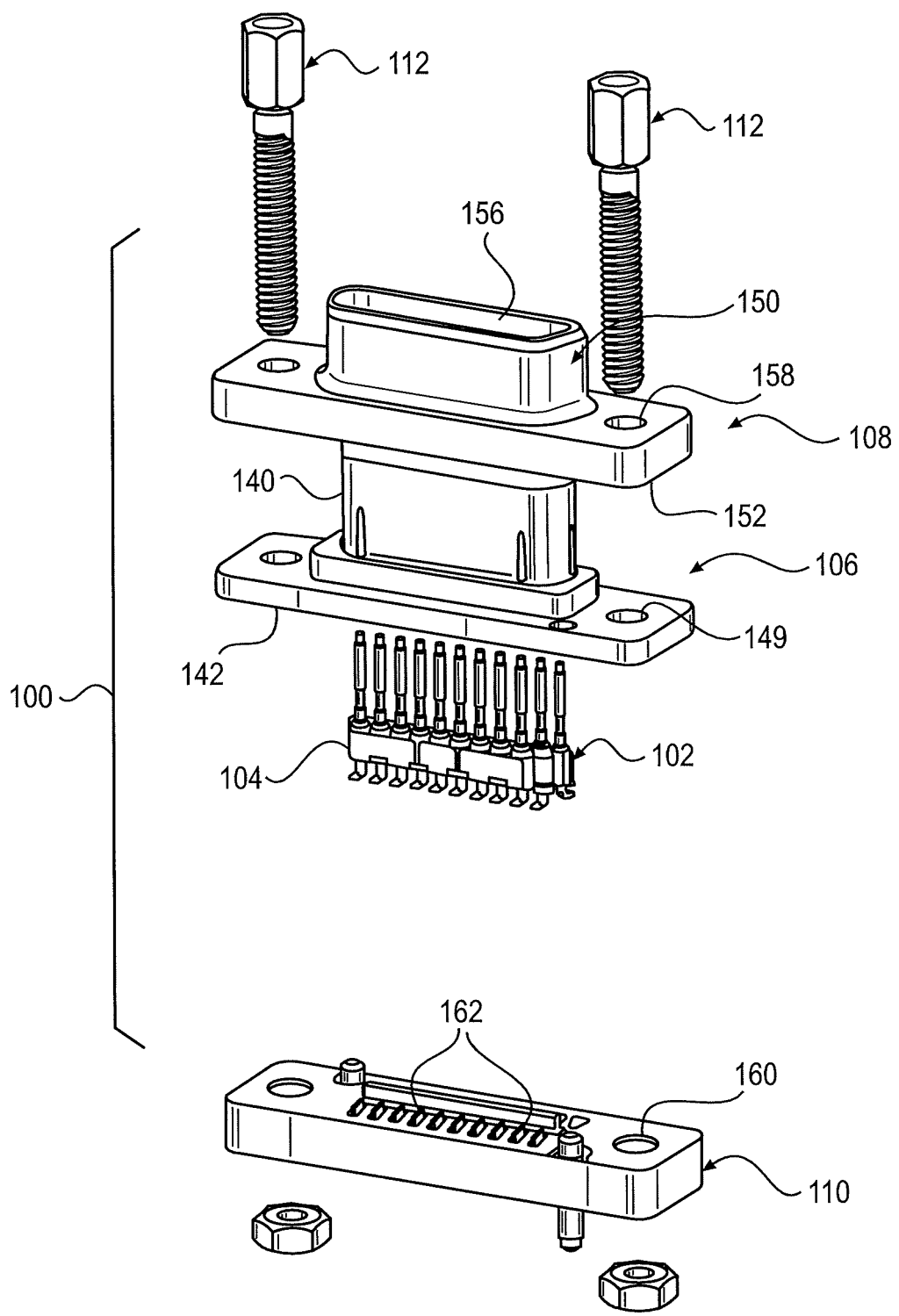
FIG. 1 is an exploded perspective view of an electrical connector of the method of assembling the same according to an exemplary embodiment of the present invention.

Referring to the figures, the present invention generally relates to a method of assembling an electrical connector 100 configured for installation on a printed circuit board 10, such as a micro D or D-shaped type connector. The method of the present invention eliminates time consuming and cumbersome assembly steps for a more efficient and faster assembly process of the connector.

Electrical connector 100 generally comprises one or more contact wafer assemblies 102 and 104 supported by an insert 106 which is received in a shell 108 of the connector. A support member 110 may be used to retain the contact wafers 102 and 104 in the insert 106 and shell 108. The support member 110, the insert 106, and the shell 108 may be coupled together, such as by one or more fasteners 112, as seen in FIGS. 2A-2C. The method of the present invention comprises the steps of assembling these components of electrical connector 100.

Figure 3:
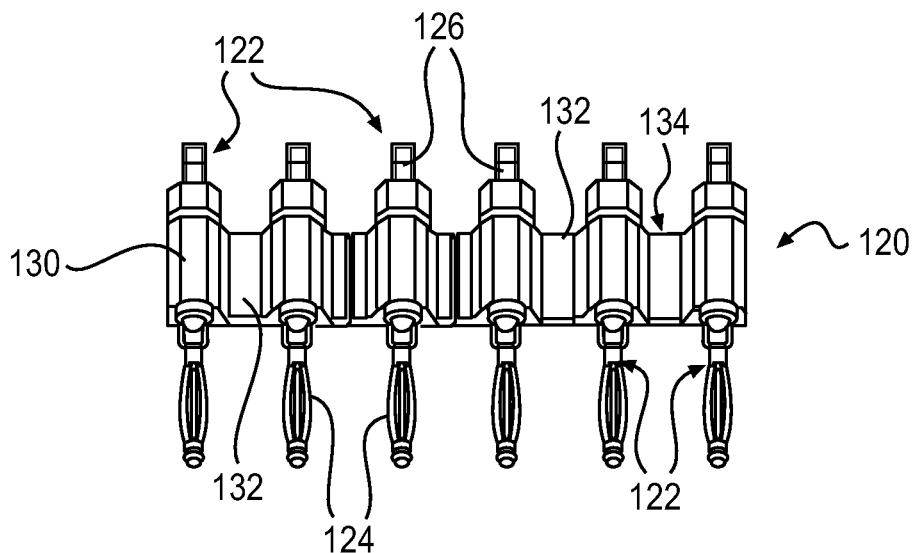
FIG. 3 is a perspective view of a contact wafer of the electrical connector illustrated in FIG. 1.
Figure 4A:
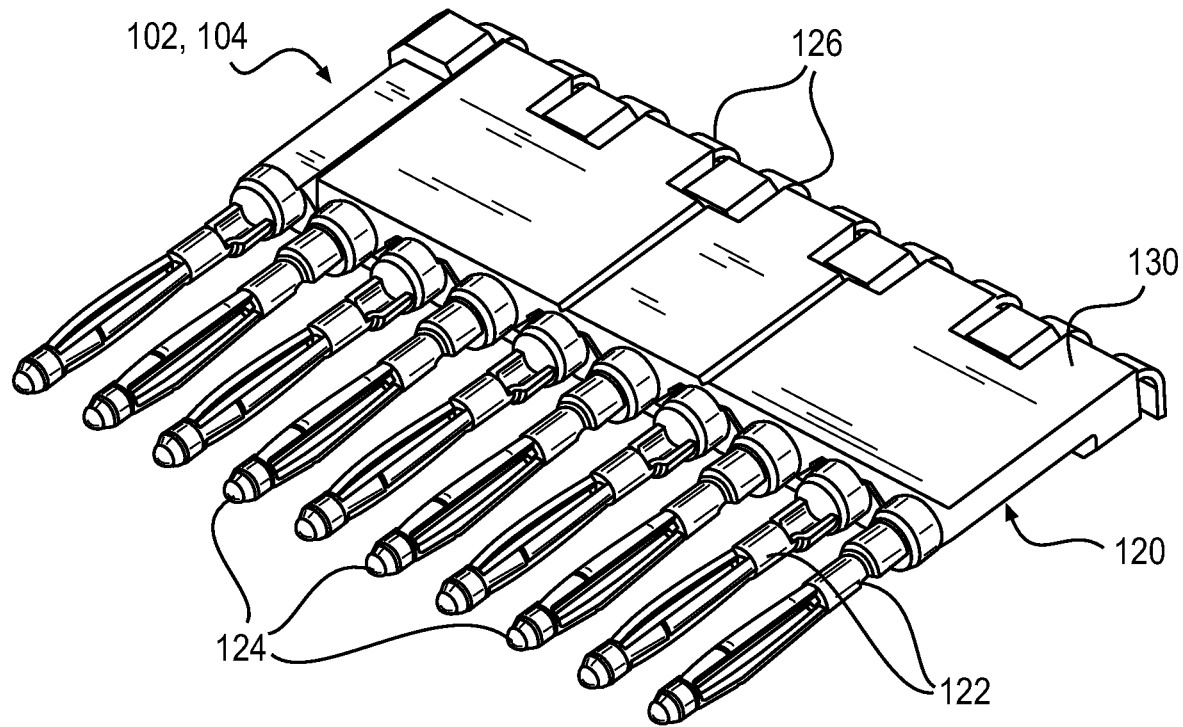
FIGS. 4A and 4B are perspective views of exemplary contact wafer assemblies of the electrical connector illustrated in FIG. 1.
Figure 4B:
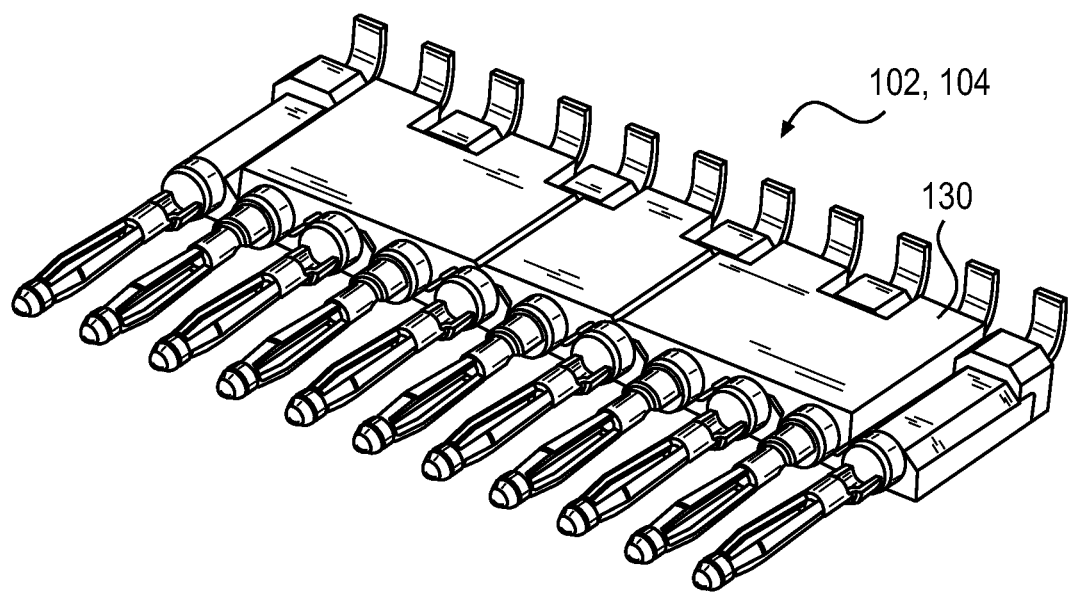

Each contact wafer assembly 102 and 104 is preferably formed by interleaving at least two contact wafers 120. Each contact wafer 120 supports a plurality of contacts 122 in a housing 130 where each contact 122 has a mating end 124 and an opposite tail end 126 extending and being exposed outside of the housing 130, as best seen in FIG. 3. Housing 130 may, for example, be overmolded onto the contacts 122 in a manner similar to that disclosed in commonly owned U.S. Pat. No. 9,362,638, the subject matter of which is herein incorporated by reference. The housing 130 may have one or more recessed surfaces 132 on at least one side 134 thereof where each recessed surface 132 is designed to receive a corresponding portion of another housing, as seen in FIGS. 4A and 4B, when interleaving the contact wafers 120 to form the contact wafers assemblies 102 and 104. Once the contact wafers 120 are interlocked, the contacts 122 of the contact wafers 120 alternate and are substantially in axial alignment. That is, the mating ends 124 of the contacts 122 of both wafers 120 may be aligned and likewise the tail ends 126 of the contacts of both wafers may be aligned.

Insert 106 may have a contact receiving portion 140, designed to receive the contact wafer assemblies 102 and 104, and a flange portion 142, designed to couple with the support member 110, as best seen in FIGS. 1 and 2A-2C. Alternatively, support member 110 may be eliminated such that flange portion 142 of insert 106 is mounted directly to the printed circuit board 10. Contact receiving portion 140 may include a housing section 144 that accommodates the housings 130 of the contact wafer assemblies 102 and 104 and a contact section 146 that accommodates the contacts 122. In a preferred embodiment, the contact section 146 includes a plurality of open ended passageways 148 that receive the individual contacts 122. Flange portion 142 may include one or more holes 149 to receive the one or more fasteners 112.

Shell 108 has an insert receiving portion 150 and a flange portion 152. The insert receiving portion 150 is sized to receive the contact receiving portion 140 of insert 106. An open end 156 of the insert receiving portion 150 exposes the mating ends 124 of the contacts 122 and defines a mating interface for connecting to a mating connector (not shown). Flange portion 152 may abut flange portion 142 of insert 106 and also has one or more holes 158 that align with the one or more holes 149 of insert 106 for receiving the fasteners 112. Support member 110 may also include one or more holes 160 that align with the holes 149 and 158 of insert 106 and shell 108, respectively, to receive the fasteners 112 and the fasteners 112 may engage the printed circuit board 10, thereby mounting the connector 100 to the board 10. In one embodiment, support member 110 may include conductive springs 162, such as c-clips, that correspond to each of the contacts 122 and engage their tails ends 126, to establish an electrical connection between the contacts 122 and the printed circuit board 10. Alternatively, the support member 110 may be eliminated and the tail ends 126 of the contacts 122 may directly engage the printed board 10, such as by soldering, to establish the electrical connection therebetween.

The method of the present invention preferably includes the step of bending the tail ends of each contact 122 of each contact wafer 120. The tails ends 126 may be bent about 90 degrees, for example, as seen in FIGS. 3, 4A, and 4B, to assist with engagement with either the conductive springs 162 of the support member 110 or with direct engagement with the printed circuit board. The tails ends 126 are preferably bent before the contact wafers 120 are interleaved to form the contact wafer assemblies 102 and 104.

Figure 5:
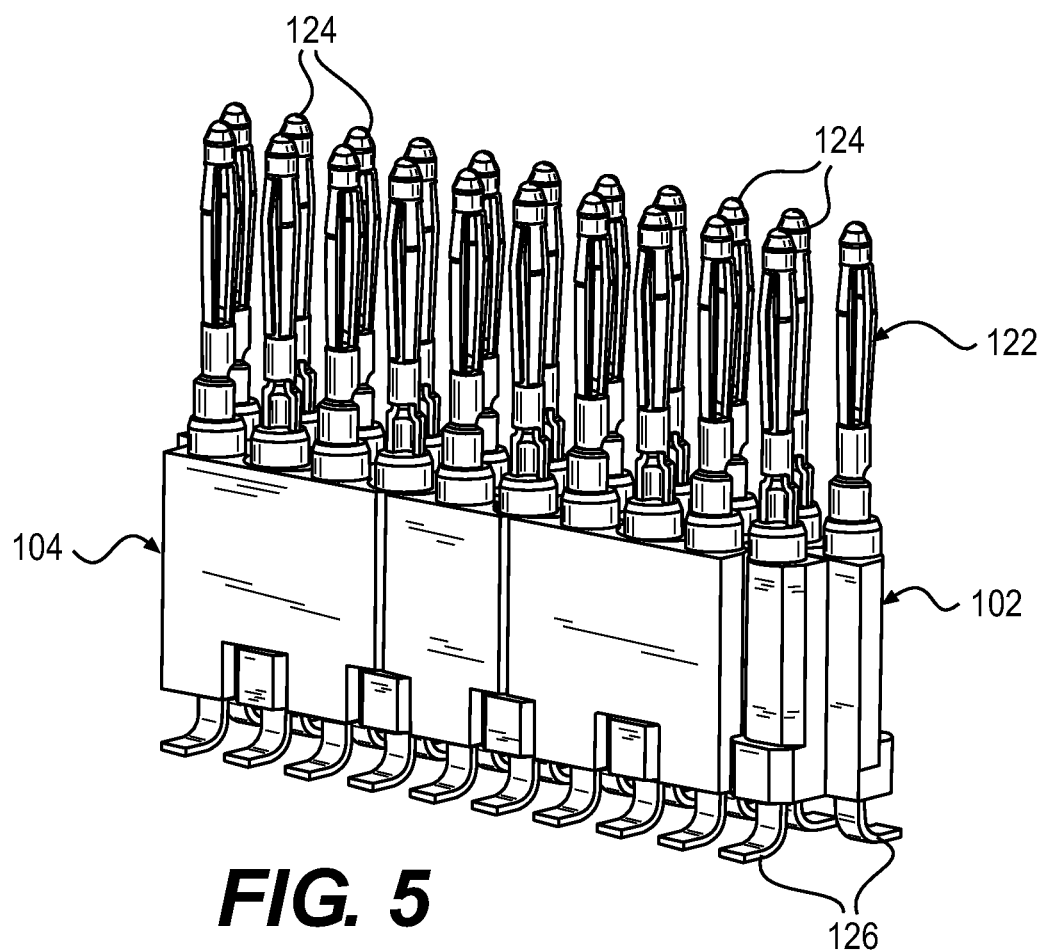
FIG. 5 is a perspective view of combined contact wafer assemblies of the electrical connector illustrated in FIG. 1.

A least two of the contact wafers 120 may be interleaved to form a contact wafer assembly, such as contact wafer assembly 102 (FIG. 4A) or contact wafer assembly 104 (FIG. 4B). Once the contact wafer assemblies 102 and 104 are formed, they can be easily loaded into the contact receiving portion 140 of the insert 106 such that the mating ends 124 of the contacts 122 are receiving in the individual passageways 148. When loading the contact wafer assemblies 102 and 104, they may be combined, as seen in FIG. 5, for loading into insert 106 such that the contact wafer assemblies 102 and 104 form a predetermined arrangement of the mating ends 124 of the plurality of contacts 122. As such, no contact or wire management is required during assembly of the connector 100.

Figure 7:
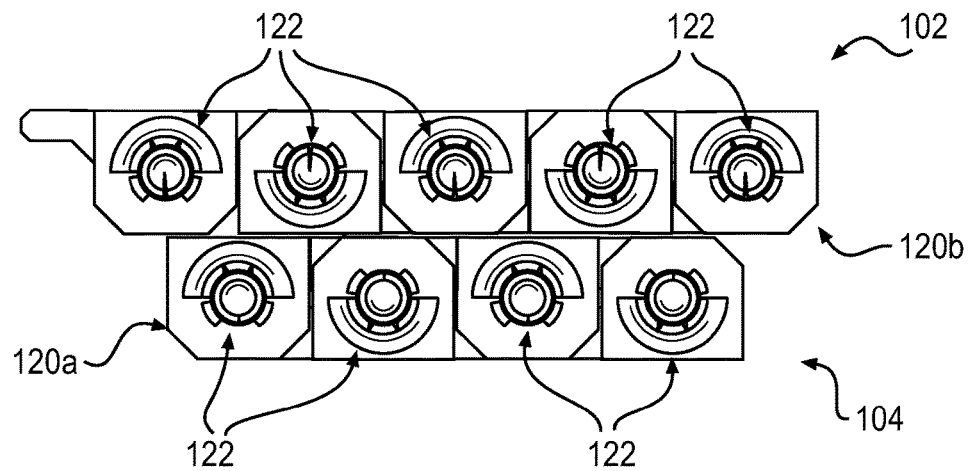
FIGS. 7-9 are an end views of an exemplary combinations of the contact wafers illustrated in FIG. 6, e.g. 9-position, 25-position, and 51-position, respectively, according to an exemplary embodiment of the present invention.

The insert 106 with the contact wafer assemblies 102 and 104 loaded therein, can then be inserted into the insert receiving portion 150 of shell 108 such that the contact mating ends 124 are in the predetermined arrangement at the mating interface of the electrical connector, that is at the open end 156 of shell 108. Because the contacts 122 are fully supported in their predetermined arrangement by insert 106, no potting or epoxy material or layer needs to be added to the connector 100 during assembly. The predetermined arrangement of the mating ends 124 of the contacts 122 may be selected based on the desired connector type, e.g. 9-position, a 15-position, a 21-position, a 25-position, a 31-position, a 37-position, a 41-position, a 51-position, a 69-position, or a 100-position or any other varying number of contacts, as desired. FIG. 7, for example, illustrates a 9-position arrangement of the contacts 122 in which one contact wafer assembly 102 includes five contacts and the other contact wafer assembly 104 includes four contacts. Once the loaded insert 106, shell 108, and support member 110 are coupled together, the connector 100 may then be tested for electrical conductively therethrough prior to shipping to a customer.

Figure 6:
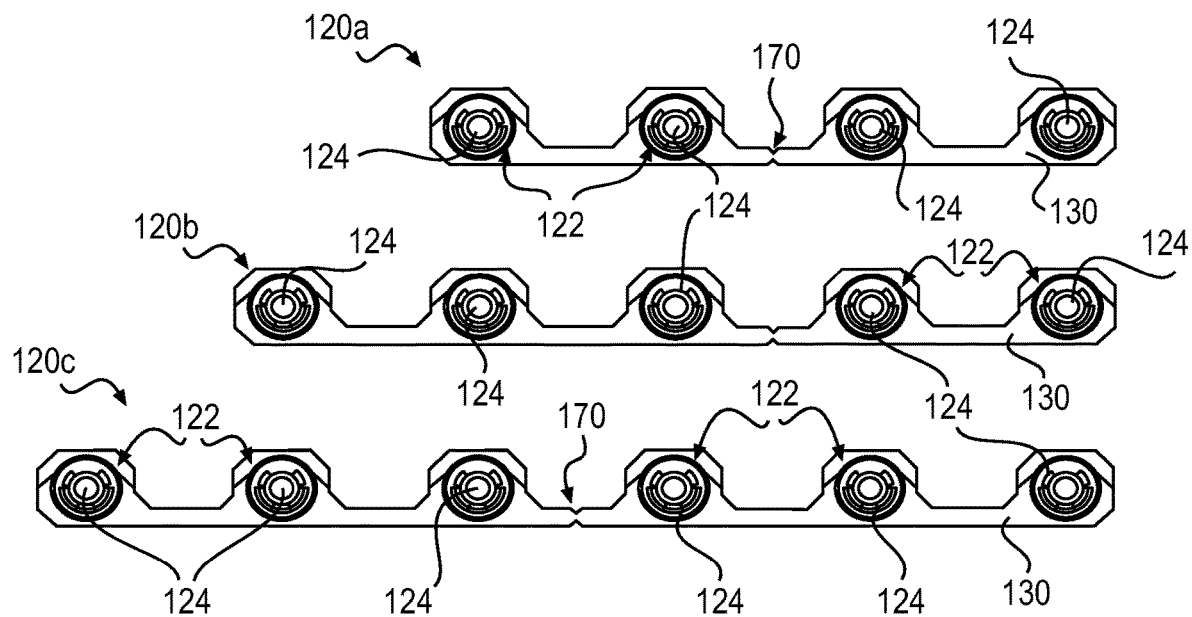
FIG. 6 are end views of exemplary contact wafers in accordance with an exemplary embodiment of the present invention.

In a preferred embodiment, the contact wafers 120 may have a different number of contacts 122 from one another. For example, each contact wafer 120 may be one of three types, that is a 4-contact type wafer 120a, a 5-contact type wafer 120b, and 6-contact type wafer 120c, as seen in FIG. 6. Each of the 4, 5 and 6-contact type wafers 120a, 120b, and 120c has 4, 5, and 6 contacts 122, respectively, supported in the housing 130. Each housing 130 of 4, 5 and 6-contact type wafers 120a, 120b, and 120c may have one or more weakened areas 170 allowing the wafers to be broken apart into more than one wafer. Using the breakable 4, 5 and 6-contact type wafers 120a, 120b, and 120c, any of the connector positions (e.g. 9-position, 15-position, 21-position, 25-position, 31-position, 37-position, 41-position, 51-position, 69-position, or 100-position) can be arranged. For example, the 9-position contact arrangement illustrated in FIG. 7 is formed by combining contact wafer assembly 102 with five contacts and contact wafer assembly 104 with four contacts. Contact wafer assembly 102 may be created, for example, by interleaving two of the contact wafers 120 which are formed by breaking the 5-contact type wafer 120b into two the wafers via weakened area 170 with one wafer have two contacts and the other wafer having the remaining three contacts. Similarly, the other contact wafer assembly 104 may be created, for example, by interleaving two of the contact wafers formed by breaking the 4-position type wafer 120a into the two wafers each having two contacts. When these contact wafer assemblies 102 and 104 are combined and loaded into insert 106 and shell 108, the result is a 9-position contact arrangement ready for connection to a corresponding mating connector at open end 156.

Figure 8:
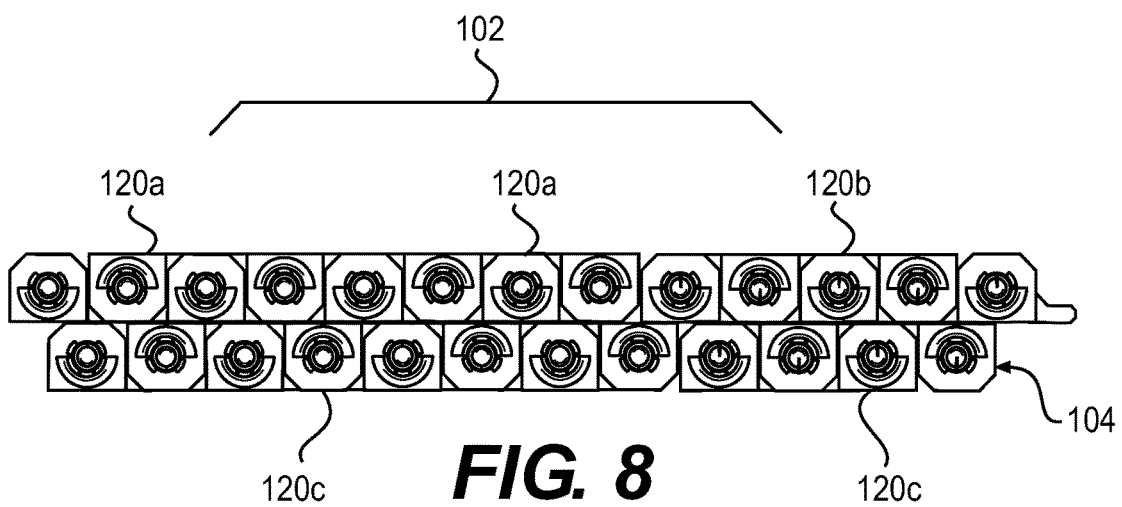
Figure 9:
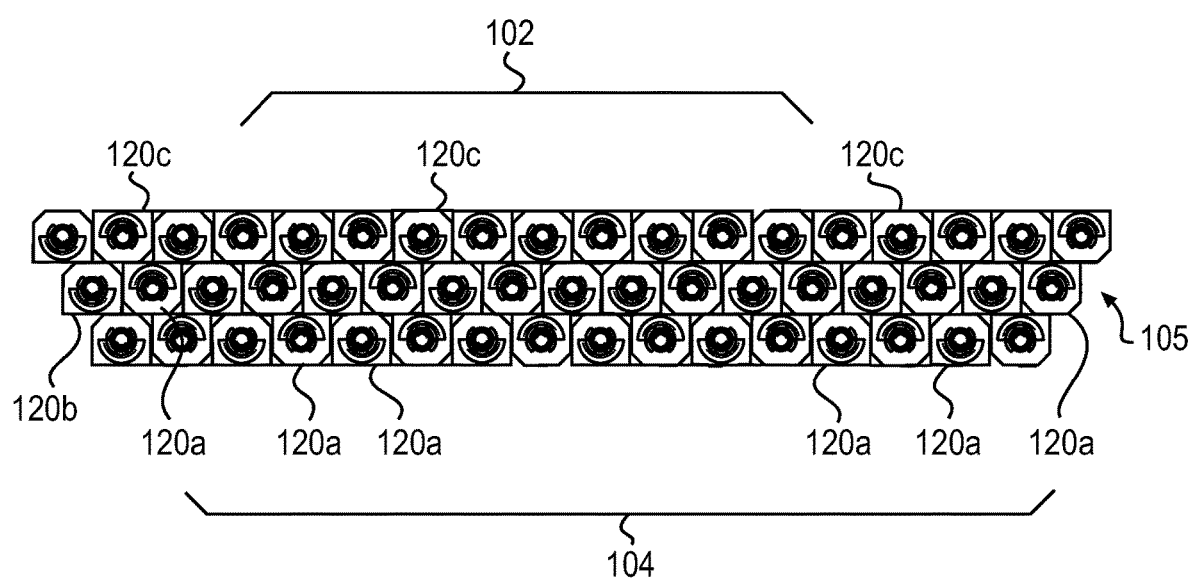

Similarly, the 25-position contact arrangement illustrated in FIG. 8, for may be formed by interleaving two 4-contact type wafers 120a plus one 5-contact type wafer 120b that is broken into two and three contacts interleaved for contact wafer assembly 102; and interleaving two 6-contact type wafers 120c for the other contact wafer assembly 104. Another example is the 51-position contact arrangement shown in FIG. 9, which is formed in a similar manner. That is contact wafer assembly 102 is formed by interleaving two 6-contact type wafers 120c plus one 6-contact type wafer 120c broken in half and interleaved. The other contact wafer assembly 104 may be formed by interleaving four of the 4-contact type wafers 120a. Yet another contact wafer assembly 105 is provided between the contact wafer assemblies 102 and 104 to complete the 51-position contact arrangement. The middle contact wafer assembly 105 may be formed by one 4-contact type wafer 120a interleaved with one 5-contact type wafer 120b plus two 4-contact wafers 120a interleaved with one another.

While particular embodiments have been chosen to illustrate the invention, it will be understood by those skilled in the art that various changes and modifications can be made therein without departing from the scope of the invention as defined in the appended claims.

What is claimed is:

1. A method of assembling an electrical connector, the electrical connector being configured for mounting to a printed circuit board, comprising the steps of:
   providing a plurality of contact wafers, each contact wafer including a plurality of contacts supported by a housing, wherein each of the plurality of contacts includes a mating end for engaging a mating connector and a tail end for electrically connecting to the printed circuit board, the mating and tail ends being exposed outside of the housing;
   bending the tail ends of each contact wafer;
   interleaving the contact wafers to form one or more contact wafer assemblies;
   loading the one or more contact wafer assemblies into an insert of the electrical connector, such that the one or more contact wafer assemblies form a predetermined arrangement of the mating ends of the plurality of contacts at a mating interface of the electrical connector;
   inserting the insert, with the one or more contact wafer assemblies, into a shell of the electrical connector; and
   installing a contact support member at the tail ends of the contact wafers, wherein the contact support member includes a plurality of conductive springs corresponding to each of the plurality of contacts.

2. The method of claim 1, further comprising the step of coupling the insert, the shell, and the contact support together.

3. The method of claim 2, further comprising the step of testing the electrical connector for electrical conductivity therethrough after the step of coupling the insert, the shell, and the contact support together.

4. The method of claim 2, wherein the step of coupling includes inserting at least one fastener through each of the insert, the shell, and the contact support member, the fastener being configured to engage the printed circuit board for mounting the electrical connector thereto.

5. The method of claim 4, wherein the fastener is configured to engage the printed circuit board for mounting the electrical connector thereto such that the one or more contact wafer assemblies are electrically connected to the printed circuit board via the tail ends of the plurality of contacts.

6. The method of claim 1, further comprising the step of soldering the tail ends of the plurality of contacts to the printed circuit board.

7. The method of claim 1, wherein no potting material is added to the electrical connector.

8. The method of claim 1, wherein neither the step of loading the one or more contact wafer assemblies in the insert nor the step of inserting the insert into the shell, includes the step of managing terminations of the plurality of contacts.

9. The method of claim 1, further comprising the step of combining at least two contact wafer assemblies to form the predetermined arrangement of the mating ends of the plurality of contacts.

10. The method of claim 9, wherein the contact wafers of one of the two contact wafer assemblies have a different number of plurality of contacts from one another.

11. The method of claim 10, wherein the contact wafers of the other of the two contact wafer assemblies have a different number of plurality of contacts from one another.

12. The method of claim 1, further comprising the step of selecting from the plurality of contact wafers at least two contact wafers that have a different number of the plurality of contacts from one another to form at least one of the contact wafer assemblies.

13. The method of claim 1, wherein each of the contact wafers has a different number of contacts from the other contact wafers.

14. The method of claim 13, further comprising the step of combining at least two of the contact wafer assemblies to form the predetermined arrangement of the mating ends of the plurality of contacts.

15. A method of assembling an electrical connector, the electrical connector being configured for mounting to a printed circuit board, comprising the steps of:
providing a plurality of contact wafers, each contact wafer including a plurality of contacts supported by a housing, wherein each of the plurality of contacts includes a mating end for engaging a mating connector and a tail end for electrically connecting to the printed circuit board, the mating and tail ends being exposed outside of the housing, and wherein at least one contact wafer is formed with four contacts, at least one contact wafer is formed with five contacts, and at least one contact wafer is formed with six contacts;
interleaving the contact wafers to form one or more contact wafer assemblies;
loading the one or more contact wafer assemblies into an insert of the electrical connector, such that the one or more contact wafer assemblies form a predetermined arrangement of the mating ends of the plurality of contacts at a mating interface of the electrical connector; and
inserting the insert, with the one or more contact wafer assemblies, into a shell of the electrical connector.

16. The method of claim 15, wherein the step of interleaving includes interleaving one of the contact wafers with four, five, or six contacts with another of the contact wafers with four, five, or six contacts to form at least a first contact wafer assembly of the contact wafer assemblies.

17. The method of claim 16, wherein the step of interleaving includes interleaving one of the contact wafers with four, five, or six contacts with another of the contact wafers with four, five, or six contacts to form at least a second contact wafer assembly of the contact wafer assemblies.

18. The method of claim 17, further comprising the step of combining the first and the second contact wafer assemblies to form the predetermined arrangement of the mating ends of the plurality of contacts.

19. The method of claim 18, wherein the step of loading the contact assemblies into the insert includes loading the combined first and second contact wafer assemblies.

20. The method of claim 15, wherein each of the contact wafers with four, five, and six contacts includes at least one weakened area between the contacts.

21. The method of claim 20, further comprising the step of breaking at least one of the contact wafers with four, five, and six contacts at the at least one weakened area, thereby forming multiple contact wafers therefrom.

22. The method of claim 15, further comprising the step of bending the tail ends of each contact wafer prior to the step of interleaving the contact wafers.

23. The method of claim 15, wherein the predetermined arrangement of the mating ends of the plurality contacts at the mating interface of the electrical connector is one of a 9-position, a 15-position, a 21-position, a 25-position, a 31-position, a 37-position, a 41-position, a 51-position, a 69-position, or a 100-position.

24. A method of assembling an electrical connector, the electrical connector being configured for mounting to a printed circuit board, comprising the steps of:
providing a plurality of contact wafers, each contact wafer including a plurality of contacts supported by a housing, wherein each of the plurality of contacts includes a mating end for engaging a mating connector and a tail end for electrically connecting to the printed circuit board, the mating and tail ends being exposed outside of the housing;
bending the tail ends of each contact wafer;
interleaving the contact wafers to form one or more contact wafer assemblies;
loading the one or more contact wafer assemblies into an insert of the electrical connector, such that the one or more contact wafer assemblies form a predetermined arrangement of the mating ends of the plurality of contacts at a mating interface of the electrical connector, and the contact wafers of one of the two contact wafer assemblies have a different number of plurality of contacts from one another;
combining at least two contact wafer assemblies to form the predetermined arrangement of the mating ends of the plurality of contacts; and
inserting the insert, with the one or more contact wafer assemblies, into a shell of the electrical connector.

25. A method of assembling an electrical connector, the electrical connector being configured for mounting to a printed circuit board, comprising the steps of:
providing a plurality of contact wafers, each contact wafer including a plurality of contacts supported by a housing, wherein each of the plurality of contacts includes a mating end for engaging a mating connector and a tail end for electrically connecting to the printed circuit board, the mating and tail ends being exposed outside of the housing;
bending the tail ends of each contact wafer;
interleaving the contact wafers to form one or more contact wafer assemblies;
loading the one or more contact wafer assemblies into an insert of the electrical connector, such that the one or more contact wafer assemblies form a predetermined arrangement of the mating ends of the plurality of contacts at a mating interface of the electrical connector;

selecting from the plurality of contact wafers at least two contact wafers that have a different number of the plurality of contacts from one another to form at least one of the contact wafer assemblies; and inserting the insert, with the one or more contact wafer assemblies, into a shell of the electrical connector.

* * * * *